US009312986B2

(12) United States Patent
Hatefi et al.

(10) Patent No.: US 9,312,986 B2
(45) Date of Patent: Apr. 12, 2016

(54) METHOD OF TRANSMITTING A DIGITAL SIGNAL FOR A MARC SYSTEM WITH A FULL-DUPLEX RELAY, A CORRESPONDING PROGRAM PRODUCT AND RELAY DEVICE

(75) Inventors: Atoosa Hatefi, Paris (FR); Raphael Visoz, Vanves (FR); Antoine Berthet, Chatenay Malabry (FR)

(73) Assignee: ORANGE, Paris (FR)

( * ) Notice: Subject to any disclaimer, the term of this patent is extended or adjusted under 35 U.S.C. 154(b) by 866 days.

(21) Appl. No.: 13/496,814

(22) PCT Filed: Sep. 17, 2010

(86) PCT No.: PCT/FR2010/051942
§ 371 (c)(1),
(2), (4) Date: Oct. 5, 2012

(87) PCT Pub. No.: WO2011/033237
PCT Pub. Date: Mar. 24, 2011

(65) Prior Publication Data
US 2013/0034044 A1 Feb. 7, 2013

(30) Foreign Application Priority Data
Sep. 17, 2009 (FR) .................................... 09 56373

(51) Int. Cl.
*H03M 13/37* (2006.01)
*H04L 1/00* (2006.01)
(Continued)

(52) U.S. Cl.
CPC ......... *H04L 1/0048* (2013.01); *H03M 13/3746* (2013.01); *H03M 13/3761* (2013.01);
(Continued)

(58) Field of Classification Search
CPC ..................................................... H04W 16/26
USPC .......... 370/243, 252, 328, 315, 468; 375/211, 375/341
See application file for complete search history.

(56) References Cited

U.S. PATENT DOCUMENTS 5,537,444 A * 7/1996 Nill et al. ....................... 375/341
5,694,404 A 12/1997 Huang
(Continued)

FOREIGN PATENT DOCUMENTS

EP          1729435 A1    12/2006
WO    2006071187 A2    7/2006

OTHER PUBLICATIONS

Wang, T.; Giannakis, G.B.: "Complex Field Network Coding for Multiuser Cooperative Communications," Selected Areas in Communications, IEEE Journal on, vol. 26, No. 3, pp. 561-571, Apr. 2008.
(Continued)

*Primary Examiner* — Andrew Lai
*Assistant Examiner* — Andrew C Lee
(74) *Attorney, Agent, or Firm* — David D. Brush; Westman Champlin & Koehler, P.A.

(57) ABSTRACT

A method and apparatus for transmitting a signal for a network having at least four nodes comprising two transmitters, a relay, and a receiver that are connected together by non-orthogonal links implementing a spatially-distributed network code. The method includes each transmitter delivering a code word per block of K information bits and transmitting the code words during N time slots; iterative joint detection/decoding in the relay to separate respective streams and determine, per stream, a vector representative of the received code word; jointly coding two vectors derived from the two streams to determine redundancy information representative of two code words transmitted during N time slots; transmitting, by the relay, redundancy information during N time slots; and sequencing in the relay such that the redundancy information transmitted during the N time slots corresponds to the code words transmitted during the preceding N time slots.

13 Claims, 6 Drawing Sheets

(51) Int. Cl.
| | |
|---|---|
| *H04L 25/03* | (2006.01) |
| *H03M 13/11* | (2006.01) |
| *H03M 13/15* | (2006.01) |
| *H03M 13/23* | (2006.01) |
| *H03M 13/29* | (2006.01) |
| *H04B 7/155* | (2006.01) |
| *H04L 1/06* | (2006.01) |

(52) U.S. Cl.
CPC ........ *H04L1/0076* (2013.01); *H04L 25/03331* (2013.01); *H03M 13/1102* (2013.01); *H03M 13/1171* (2013.01); *H03M 13/15* (2013.01); *H03M 13/152* (2013.01); *H03M 13/1515* (2013.01); *H03M 13/23* (2013.01); *H03M 13/2957* (2013.01); *H04B 7/15521* (2013.01); *H04L 1/0057* (2013.01); *H04L 1/06* (2013.01); *H04L 2001/0097* (2013.01)

(56) References Cited

U.S. PATENT DOCUMENTS

| | | | |
|---|---|---|---|
| 5,838,267 A * | 11/1998 | Wang et al. | 341/94 |
| 5,944,850 A * | 8/1999 | Chouly et al. | 714/790 |
| 6,122,763 A * | 9/2000 | Pyndiah et al. | 714/755 |
| 6,324,668 B1* | 11/2001 | Classon | 714/783 |
| 6,456,598 B1* | 9/2002 | Le Strat et al. | 370/252 |
| 6,598,188 B1* | 7/2003 | Locke et al. | 714/704 |
| 6,898,248 B1* | 5/2005 | Elgamal et al. | 375/259 |
| 7,065,146 B1* | 6/2006 | Lou et al. | 375/262 |
| 7,971,131 B1* | 6/2011 | Ordentlich et al. | 714/786 |
| 8,386,878 B2* | 2/2013 | Pi et al. | 714/752 |
| 2005/0128966 A1* | 6/2005 | Yee | 370/310 |
| 2008/0075158 A1* | 3/2008 | Li | 375/232 |
| 2008/0101403 A1 | 5/2008 | Michael et al. | |
| 2008/0282133 A1* | 11/2008 | Lo et al. | 714/786 |
| 2009/0252146 A1* | 10/2009 | Luo et al. | 370/351 |
| 2009/0287979 A1* | 11/2009 | Wang et al. | 714/752 |
| 2010/0077277 A1* | 3/2010 | Shen et al. | 714/752 |
| 2010/0207789 A1 | 8/2010 | Nieminen | |
| 2010/0238984 A1* | 9/2010 | Sayana et al. | 375/219 |

OTHER PUBLICATIONS

Xi Cai; Qingchun Chen; Pingzhi Fan; Zheng Ma: "On the coded complex field network coding scheme for multiuser cooperative communications with regenerative relays," Communication Technology (ICCT), 2011 IEEE 13th International Conference on, pp. 961-965, Sep. 25-28, 2011.
Ghrayeb, Ali., et al.: "Coding for MIMO Communication Systems", Wiley, Chapter 7, May 2008, pp. 162-205.
International Search Report and Written Opinion dated Jun. 4, 2011 for International Application No. PCT/FR2010/052583, filed Dec. 1, 2010.
International Preliminary Report on Patentability and English translation of the Written Opinion dated Jul. 4, 2012 for corresponding International Application No. PCT/FR010/052583, filed Dec. 1, 2010.
Sankaranarayanan L. et al.: "Hierarchical sensor networks: capacity bounds and cooperative strategies using the multiple-access relay channel model", Sensor and Ad Hoc Communications and Networks, 2004, IEEE Secon 2004, 2004 First Annual IEEE Communications Society Conference on Santa Clara, CA, USA, Oct. 4, 2004, pp. 191-199.
Georg Zeitler et al.: "Design of network coding functions in multihop relay networks", Turbo Codes and Related Topics, 2008 5th International Symposium on, IEEE, Piscataway, NJ, USA, Sep. 1, 2008, pp. 249-254.
Georg Zeitler et al.: "An adaptive compress-and-forward scheme for the orthogonal multiple-access relay channel", Personal, Indoor Mobile radio Communications, IEEE 20th International Symposium on, IEEE, Piscataway, NJ, USA, Sep. 13, 2009, pp. 1838-1842.
Hausl et al., "Iterative network and channel coding on a Tanner graph," Proc. Annual Allerton Conference on Communication, Control and Computing, Monticello, IL, 2005.
Bahl et al., "Optimal Decoding of Linear Codes for minimizing symbol error rate", IEEE Transactions on Information Theory, vol. IT-20(2), pp. 284-287, Mar. 1974.
Yang et al., "Network coding over a noisy relay: A belief propagation approach", in Proc. IEEE ISIT'07, Nice, France, Jun. 2007.
International Search Report and Written Opinion dated Jan. 17, 2011 for corresponding International Application No. PCT/FR2010/051942, filed Sep. 17, 2010.
Christoph Hausi et al., "Joint Network-Channel Coding for the Multiple-Access Relay Channel", Sensor and Ad Hoc Communications and Networks, 2006. Secon '06. 2006 3rd Annual IEEE Communications Society on, IEEE, PI, Jan. 1, 2006, pp. 817-822, XP031012271.
Xiaodong Wang et al., "Interative (Turbo) Soft Interference Cancellation and Decoding for Coded CDMA", IEEE Transactions on Communications, IEEE Service Center, Piscataway, NJ, US, vol. 47, No. 7, Jul. 1, 1999, XP011009462.
Joseph Thomas et al., "Space-Time Interative Receivers for Narrowband Multichannel Networks", IEEE Transactions on Communications, IEEE Service Center, Piscataway, NJ, US, vol. 50, No. 7, Jul. 1, 2001, XP011070965.
Tuyen Bui et al., "Iterative Approaches of Cooperative Transmission Based on Superposition Modulation", Communications and Information Technologies, 2007. ISCIT '07. INT ERNational Symposium on, IEEE, PI, Oct. 1, 2007, pp. 1423-1428, XP031166684.
Jun Hu et al., "Low Density Parity Check Codes Over Wireless Relay Channels", IEEE Transactions on Wireless Communications, IEEE Service Center, Pascataway, NJ, US, vol. 6, No. 9, Sep. 1, 2007, pp. 3384-3394, XP011195936.
Tae-Won Yune et al., "Iterative Multiuser Detection with Spectral Efficient Relaying Protocols for Single-Carrier Transmission", IEEE Transactions on Wireless Communications, IEEE Service Center, Piscataway, NJ, US, vol. 7, No. 7, Jul. 1, 2009, pp. 3789-3797, XP011264152.
International Preliminary Report on Patentability and English Translation of the Written Opinion dated Apr. 11, 2012 for corresponding International Patent Application No. PCT/FR2010/051942, filed Sep. 17, 2010.

\* cited by examiner

METHOD OF TRANSMITTING A DIGITAL SIGNAL FOR A MARC SYSTEM WITH A FULL-DUPLEX RELAY, A CORRESPONDING PROGRAM PRODUCT AND RELAY DEVICE

CROSS-REFERENCE TO RELATED APPLICATIONS

This Application is a Section 371 National Stage Application of International Application No. PCT/FR2010/051942, filed Sep. 17, 2010, which is incorporated by reference in its entirety and published as WO WO2011/033237 on Mar. 24, 2011, not in English.

STATEMENT REGARDING FEDERALLY SPONSORED RESEARCH OR DEVELOPMENT

None.

THE NAMES OF PARTIES TO A JOINT RESEARCH AGREEMENT

None.

FIELD OF THE DISCLOSURE

The field of the disclosure is that of transmitting coded data in a multiple access relay channel (MARC) network. A MARC network is a telecommunications system having at least four nodes comprising at least two transmitters, a relay, and a receiver. More precisely, the disclosure relates to network coding and involves improving the quality of data transmission, and in particular improving the performance of error-correcting decoding in a receiver.

The disclosure applies particularly, but not exclusively, to transmitting data via mobile networks, e.g. in real time applications.

BACKGROUND OF THE DISCLOSURE

Networks, in particular mobile networks, are looking for significant gains in terms of capacity, reliability, energy consumption, etc. The transmission channel of a mobile network has the reputation of being difficult and leads to relatively mediocre transmission reliability. Significant progress has been achieved in recent years in terms of coding and modulation, in particular for energy consumption considerations and capacity considerations. In a mobile network where a plurality of transceivers share the same resources (time, frequency, and space), it is necessary to keep transmission power as low as possible.

Such low power goes against coverage and thus against the capacity of the system, and more generally against its performance.

Figures 1, 2:
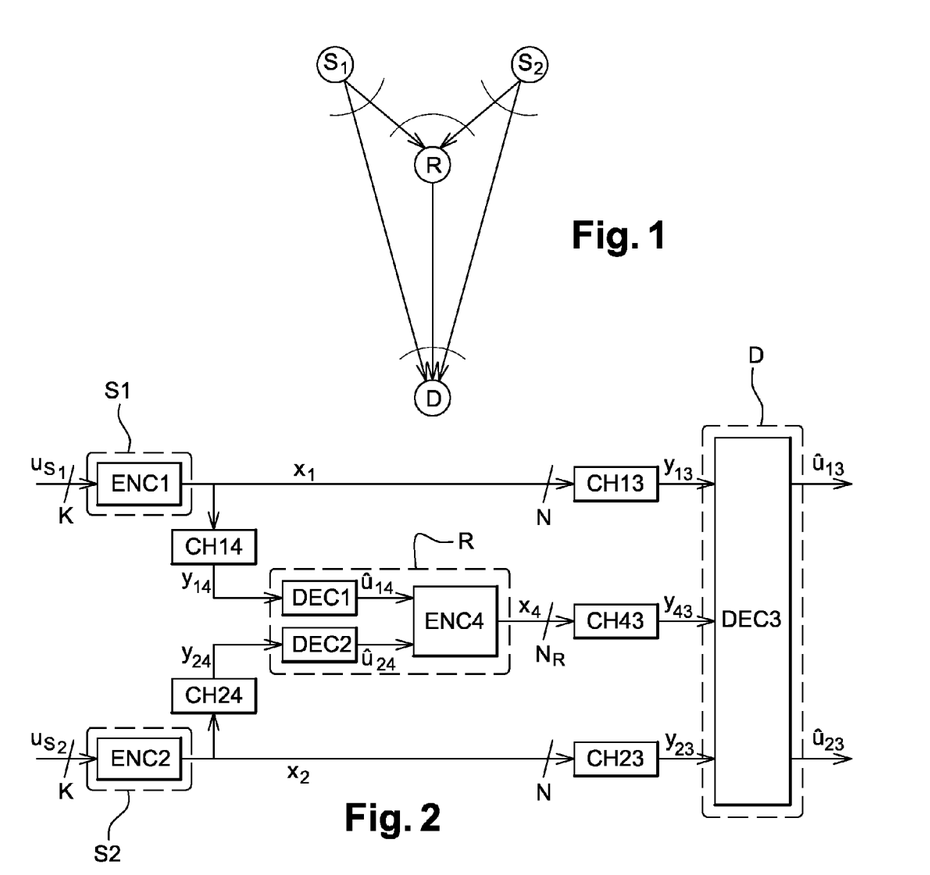
FIG. 1 is a diagram illustrating the basic topology of MARC systems.
FIG. 2 shows a first example of a prior art MARC system with orthogonal links between the various nodes.

In order to increase coverage, to make communications more reliable, and more generally to improve performance, one approach consists in relying on relays for increasing spectrum efficiency and thus for improving the transmission efficiency and the reliability of systems. The topology of MARC systems as shown in FIG. 1 is such that the sources, nodes $S_1$ and $S_2$, broadcast their coded information sequences for the attention of the relay R and of the destination D. The relay decodes the signals it receives from the sources $S_1$ and $S_2$ and it re-encodes them jointly while adding its own redundancy so as to create a spatially-distributed network code. At the destination D, the decoding of the three spatially-distributed coded sequences, comprising two coded sequences received directly from the sources S1 and S2 and the coded sequence coming from the relay, relies on joint channel/network decoding algorithms.

Network coding is a form of co-operation in which the nodes of the network share not only their own resources (power, band, etc.) but also their calculation capacity, so as to create distributed coding of power that increases with continuing propagation of information through the nodes. It provides substantial improvements in terms of diversity and of coding, and thus of transmission reliability.

Two types of operation are known for the relay: half-duplex mode and full-duplex mode.

In half-duplex mode, there are two transmission stages that correspond to different time slots since the relay is not capable of receiving and transmitting simultaneously. During the first stage that comprises the first time slots (also referred to as transmission intervals), both of the sources transmit but not the relay. The relay decodes and re-encodes jointly in order to deduce the signal it is to transmit during the following time slots. During the second stage that comprises the second time slots, the relay transmits the signal it determined during the first time slots, and the sources transmit the parity second sequences relating to the same information as the information transmitted during the first time slots. Half-duplex type relays are attractive because of a communications scheme that is simple and because of the ease with which they can be implemented and the low cost that stems therefrom.

In full-duplex mode, the relay receives the new information blocks from the two sources and it transmits simultaneously to the destination its own code word based on blocks it has received beforehand. Compared with a half-duplex relay, a full-duplex relay makes it possible to achieve greater capacity.

Articles [1] and [2] describe joint channel/network coding for a MARC system, as shown in FIG. 2. The MARC system under consideration is such that the links CH14, CH24, CH13, CH43, and CH23 are orthogonal, and in addition the links between the two sources and the relay are assumed to be completely reliable. In that application, a link is a communications channel between two or more nodes, and it may be physical or logical. When the link is physical, then it is generally referred to as a "channel". The two sources S1 and S2 broadcast the coded information to the relay R and to the destination D during the first transmission stage. The relay R takes the streams that it is assumed to have decoded perfectly from the two users, and it combines them in linear manner by using a linear network coding scheme. During the second stage, the relay transmits an additional parity sequence to the destination D. Once all of the streams have been received, stored, and reorganized by the destination, this joint channel/network code may be considered as a spatially-distributed joint channel/network code that may be decoded iteratively. This joint code leads to substantial gains in terms of diversity and coding.

Figure 3:
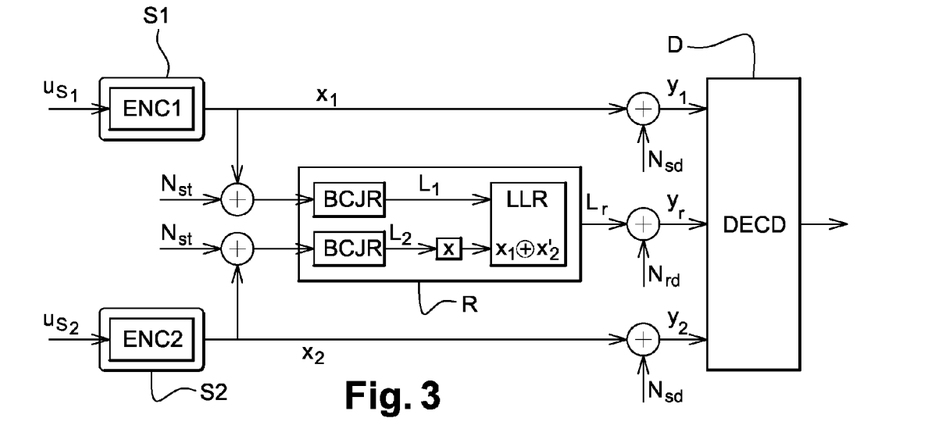
FIG. 3 shows a second example of a prior art MARC system with orthogonal links between the various nodes.

S. Yang and R. Koetter [3] have evaluated the performance of network coding for a MARC system, as shown in FIG. 3, with orthogonal links, but in the presence of source-relay links that are noisy. The authors propose the soft decode-and-forward technique that relies on generating a discrete probability distribution for the bits that are to be transmitted, as obtained by an algorithm that calculates a posteriori probabilities (APP) for the coded bits/symbols. Each source S1, S2 generates a code word that is transmitted to the relay R. The relay R decodes them in the form of a logarithmic likelihood ratio (LLR) using a BCJR decoding algorithm, named after its authors L. Bahl, J. Cocke, F. Jelinek, and J. Raviv [4], and then performs memoryless weighted network coding corresponding to the bitwise modulo two sum (XOR operation) of the two received code words, the weighted coding consisting in using the LLRs $L_1$, $L_2$ of the two sources to generate a third LLR $L_R$ corresponding to the XOR operation. Finally, this third LLR is transmitted in analog form to the destination D. Thus, the destination has three observations: those coming from the two sources and that from the LLR. The destination performs joint and iterative decoding of the streams from the sources $S_1$ and $S_2$ while making use of the additional information provided by the relay. The article states that even with $S_1 \rightarrow R$ and $S_2 \rightarrow R$ links that are severely noisy, the network coding provides a coding improvement compared with a scheme without co-operation, and thus without a relay. The method is described when using binary phase shift keying (BPSK) and it cannot be transposed to modulation of an order greater than two since the expression calculated during the third step is applicable only to modulation of order two or of order four (e.g. quadrature phase shift keying (QPSK)).

In those various known systems, decoding errors are reduced solely in the absence of interference, since the MARC system under consideration is assumed to be without interference as a result of the orthogonal links. Furthermore, the constraint that consists in imposing orthogonal links leads to non-optimum utilization of the spectrum resource and thus to a limit on the capacity of the network.

SUMMARY

An illustrative embodiment of the invention provides a method of transmitting a digital signal for a network having at least four nodes comprising two transmitters, a relay, and a receiver that are connected together by non-orthogonal links implementing a spatially-distributed network code, the method comprising:
  one coding step per transmitter, each delivering a code word per block of K information bits;
  a transmission step in which both transmitters transmit their respective code words during N time slots;
  an iterative joint detection/decoding step performed in the relay to separate the streams coming from the two transmitters and to determine, per stream, a vector representative of the received code word;
  a joint coding step in the relay for coding two vectors derived respectively from the two streams in order to determine redundancy information representative of two code words transmitted during N time slots;
  a transmission step of the relay transmitting redundancy information during N time slots; and
  sequencing in the relay such that the redundancy information as transmitted during the N time slots corresponds to the code words transmitted during the preceding N time slots.

An embodiment of invention also provides a full-duplex relay for a MARC system.

Thus, a relay of an embodiment of the invention for implementing a transmission method of an embodiment of the invention comprises:
  iterative joint detection/decoding means for separating the streams coming from the two transmitters of the MARC system and for determining, per stream, a vector representative of K information bits associated with a code word transmitted by a transmitter and received by the relay;
  joint coding means for coding two vectors of the two streams in order to determine redundancy information;
  means for transmitting the redundancy information; and
  sequencing means for transmitting redundancy information during N time slots, which information corresponds to the code words received during the preceding N time slots.

The step of transmission by the transmitters takes place simultaneously, thereby making it possible to maximize the common spectrum resource. Interference therefore exists between the signals received by the relay and by the destination because of the superposition of the source signals during their transmission firstly between the transmitters and the relay and secondly between the transmitters and the destination (the receiver).

Thus, an embodiment of the invention relies in particular on introducing a joint detection/decoding step and a joint coding step in the relay, thus enabling the streams that were transmitted simultaneously by the two sources to be separated and enabling all of the dispersed transmitters to benefit from a coding improvement in a spatially-distributed network code without decreasing spectrum efficiency. The approach of an embodiment of the invention makes it possible in the receivers to implement iterative decoding that relies on redundancy generated in the relays without requiring any increase in transmitter power in order to achieve an increase in the coverage of the system and in spectrum efficiency.

In a particular implementation, the transmitter method is such that the iterative joint detection/decoding step implements hard decoding.

This mode of decoding with hard decision-making concerning the value of each of the bits received in the relay is particularly adapted to a MARC system in which the links are perfectly reliable. In this context, the relay can decode the information coming from the sources without error. Hard decoding is thus particularly adapted to such a MARC system since it is less complex than soft decoding and since it is fast to implement.

In a particular implementation, a transmission method is such that the iterative joint detection/decoding step implements soft decoding and the joint coding step implements soft coding and marginalization performed at bit level.

This mode of decoding is particularly adapted to a MARC system with channels having Rayleigh fading and without knowledge at the sources of the source/relay channels. In this context, there is non-zero probability of the relay decoding the information coming from the sources imperfectly. Selecting soft decoding makes it possible to limit the propagation of errors by the relay.

In a particular implementation, a transmission method is such that the iterative joint detection/decoding step implements soft decoding and the joint coding step implements soft coding and compression.

This mode of decoding is particularly adapted to a MARC system with channels having Rayleigh fading and no knowledge at the sources of the source/relay channels. In this context, there is non-zero probability of the relay decoding the information coming from the sources imperfectly. Selecting soft decoding makes it possible to limit the propagation of errors by the relay. In addition, the soft coding followed by compression makes it possible to use any type of modulation in the relay, unlike the mode using hard coding and marginalization since that makes it necessary to use BPSK modulation at the relay.

In a particular implementation, a transmission method is such that the compression is performed using a minimum mean squared uncorrelated error (MMSUE) criterion.

Using the MMSUE criterion makes it possible to perform optimum estimation at the relay on the basis of a posteriori probabilities and thus makes it possible to maximize the signal-to-noise ratio (SNR) at the destination by reducing the number of errors in the relay.

In a particular implementation, a transmission method further comprises sequencing in each transmitter such that the transmitter does not transmit any code word during N time slots after transmitting B code words, where B is a parameter.

Typically, a frame contains B code words (or B blocks, each corresponding to K bits of information). In this implementation, a period of silence is imposed on the two transmitters after transmitting B code words corresponding to B blocks of K bits, i.e. after each of the two transmitters has transmitted a frame. In contrast, during this period of silence, the relay of the MARC system transmits the redundancy information determined on the basis of the most recent block to be received from each transmitter. This implementation consequently has the advantage of enabling the receiver to decode these two more recent blocks like the preceding block, i.e. while benefiting from redundancy information as determined and transmitted by the relay. Nevertheless, this advantage is attenuated by the impact on spectrum efficiency resulting from the period of silence and by the introduction of a latency time in order to be able to begin a new frame of B blocks.

An embodiment of the invention also provides a reception method for a receiver of a MARC system for implementing a transmission method of an embodiment of the invention, the method comprising:

a step of storing in B+1 blocks received data corresponding to pairs of B+1 code words transmitted respectively by the two transmitters, each transmitted during N time slots, and representative of pairs of blocks of K information bits, which K bits are associated with B items of redundancy information transmitted by the relay, each of the B items being transmitted during N time slots such that the redundancy information transmitted during N time slots corresponds to the code words transmitted during the preceding N time slots, where B is a parameter; and a step of iterative joint detection/decoding in the receiver, performed in parallel on the B+1 received data blocks in order to separate the streams coming from the transmitters starting from the first block, and also to separate the streams coming from the transmitters and from the relay starting from the following B blocks, and in order to act in parallel for the B blocks, per stream coming from the transmitters and per block, to determine a vector representative of K information bits associated with a code word by simultaneously decoding the data stream corresponding to the transmitter and the associated redundancy stream coming from the relay and provided by the following data block.

In another implementation, a reception method for a receiver of a MARC system for implementing a transmission method of an embodiment of the invention comprises:

a step of storing in B+1 blocks received data corresponding to pairs of B+1 code words transmitted respectively by the two transmitters, each transmitted during N time slots, and representative of pairs of blocks of K information bits, which bits are associated with B items of redundancy information transmitted by the relay, each being transmitted during N time slots such that the redundancy information transmitted during N time slots corresponds to the code words transmitted during the preceding N time slots, where B is a parameter; and a step of iterative joint detection/decoding in the receiver in parallel on the B+1 received data blocks to separate as output from the first block the streams coming from the transmitters, and as output from the following B−1 blocks the streams coming from the transmitters and from the relay, the B+1 blocks storing only redundancy information corresponding to the code words of the preceding data block, and for determining in parallel for the B blocks, per stream coming from the transmitters, and per block, a vector representative of K information bits associated with a code word by simultaneously decoding the data stream corresponding to the transmitter and the associated redundancy stream coming from the relay and supplied by the following data block.

An embodiment of the invention also provides a receiver for a MARC system implementing a transmission method of an embodiment of the invention, the receiver comprising:

means for storing B+1 received data blocks corresponding to two sets of B+1 code words transmitted by the two transmitters associated with B redundancy values transmitted by the relay, B being a parameter; and means for iterative joint detection/decoding in parallel on the B+1 blocks to separate the streams coming from the transmitters and from the relay and for determining, per stream and per block, a decoding vector of the K information bits.

This reception method and this receiver have the advantage of being adapted to a MARC system implementing a transmission method of an embodiment of the invention.

The various above implementations may optionally be combined with one or more of these implementations in order to define other implementations.

An embodiment of the invention also provides a MARC system, possibly a multiple-in-multiple-out (MIMO) system, that is adapted to implementing a method of an embodiment of the invention.

Thus, a MARC system of an embodiment of the invention includes a relay of an embodiment of the invention.

In a preferred implementation, the steps of the transmission and reception methods are determined by instructions of a transmission or reception program incorporated in one or more electronic circuits such as chips, which themselves may be arranged in electronic devices of the MARC system. The transmission or reception method of an embodiment of the invention may equally well be implemented when the program is loaded into a computer member such as a processor or the equivalent with the operation thereof then being controlled by executing the program.

Consequently, an embodiment of the invention also provides a computer program, in particular a computer program on or in a data medium, and suitable for implementing an embodiment of the invention. The program may make use of any programming language, and it may be in the form of source code, object code, or of code intermediate between source code and object code, such as a partially compiled form, or in any other desirable form for implementing a method of an embodiment of the invention.

The data medium may be any entity or device capable of storing the program. For example, the medium may include storage means such as a read-only memory (ROM), e.g. a compact disk (CD) ROM, or a microelectronic circuit ROM, or indeed magnetic recording means, e.g. a floppy disk or a hard disk.

Alternatively, the data medium may be an integrated circuit in which the program is incorporated, the circuit being adapted to execute or to be used in the execution of the method in question.

Furthermore, the program may be converted into a transmissible form such as an electrical or optical signal, suitable for being conveyed via an electrical or optical cable, by radio, or by other means. The program of an embodiment of the invention may in particular be downloaded from an Internet type network.

BRIEF DESCRIPTION OF THE DRAWINGS

Other characteristics and advantages appear more clearly on reading the following description of an embodiment given merely as non-limiting illustrative example with reference to the accompanying drawings, in which.

DETAILED DESCRIPTION OF ILLUSTRATIVE EMBODIMENTS

Figure 4:
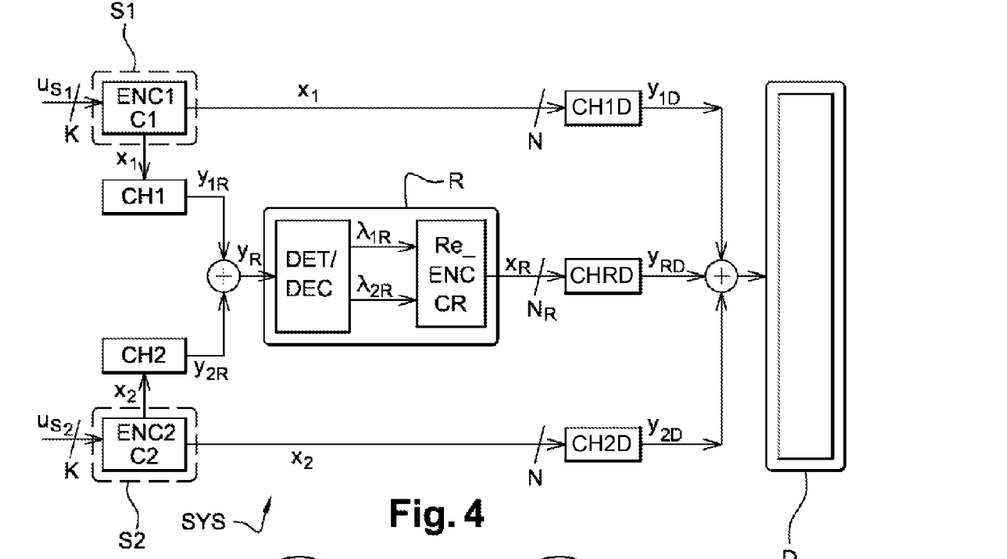
FIG. 4 shows an example of a MARC system of an embodiment of the invention with non-orthogonal links between the nodes of the system.
Figure 5:
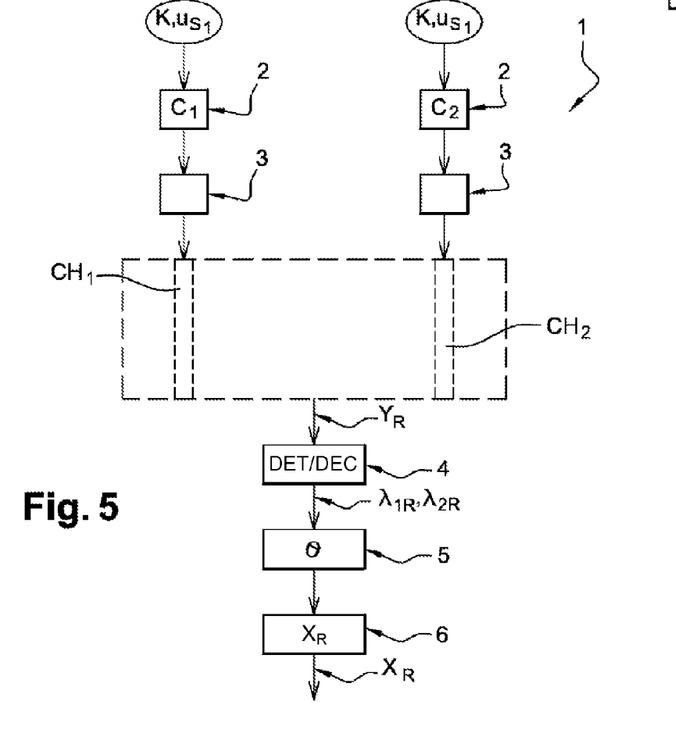
FIG. 5 is a simplified flow chart of the transmission method of an embodiment of the invention implemented by a MARC system as shown in FIG. 4.

An embodiment of the invention proposes a novel approach to using a relay of a MARC system as shown in FIG. 4 to improve the spectrum efficiency of transmission in a method 1 of an embodiment of the invention as shown in FIG. 5, while nevertheless enabling decoding to be simple and efficient in the receiver.

There is no constraint on the transmission channel; it may be subjected to fast or slow fading, it may be frequency selective, and it may be a multiple-in multiple-out (MIMO) channel. In the description below, the two sources, the relay, and the destination are assumed to be perfectly synchronized and the two sources are independent (there is no correlation between them).

The following notation is used in this application.

All vectors are written using bold characters.

A vector v has its $k^{th}$ element written $[v]_k$ or $v_k$.

A multidimensional function F takes as input a matrix A of dimension m×q in which each element $a_{ij}$ (for all i=1, ..., m and j=1, ..., q) belongs to the set E, and it outputs a matrix B of dimension n×p in which each element $b_{ij}$ (for all i=1, ..., n and j=1, ..., p) belongs to the set G, such that F(A)=B, is written:

$$F: E^{m \times q} \to G^{n \times p}$$

The probability density of a complex random variable x following a Gaussian distribution with circular symmetry of mean $\mu_x$ and of covariance $\sigma_x^2$ is written: $CN(\mu_x, \sigma_x^2)$.

$F_2$ is the two-element Galois field, R is the field of real numbers, and C is the field of complex numbers. Let X be a matrix of dimension N×M belonging to the field E, i.e. $X \in E^{N \times M}$, $x_k$ denoting its $k^{th}$ column (k=1, ..., M).

Functions are written using upper case non-italic characters.

Let x be a discrete random variable with a probability relationship p(x), E(x) designating the mathematical expectation of x:

$$E(x) = \sum_i x_i p(x_i)$$

The two sources S1, S2 (the two transmitters) that are statistically independent and fitted respectively with $T_{S_1}$ and $T_{S_2}$ antennas, act in a step 2 to code information data $u_{S_1}$, $u_{S_2}$ that is segmented into K-bit blocks by applying modulation and space time channel coding schemes $C_1$ and $C_2$ that are implemented by coders ENC1 and ENC2. The modulation and coding scheme $C_1$ or $C_2$ of a source thus acts, in a step 2, to associate any information vector $u_{S_1} \in F_2^K$, or $u_{S_2} \in F_2^K$, with respective coded and modulated symbols $$X_{S_1} \in \chi_1^{T_{S_1} \times N}, \text{ or } X_{S_2} \in \chi_2^{T_{S_2} \times N}$$

belonging to complex constellations $\chi_1$ and $\chi_2$ of cardinalities $|\chi_1|=2^p$ and $|\chi_2|=2^q$ (p,q∈N):

$$C_1: F_2^K \to \chi_1^{T_{S_1} \times N}$$
$$C_2: F_2^K \to \chi_2^{T_{S_2} \times N}$$

$X_{S_1}$ and $X_{S_2}$ are referred to below as "final" code words as transmitted respectively by the sources $S_1$ and $S_2$.

The sources then act, in a step 3, to transmit the final code words $$X_{S_1} \in \chi_1^{T_{S_1} \times N} \text{ and } X_{S_2} \in \chi_2^{T_{S_2} \times N}$$

during N channel utilizations (N time slots) to the relay and to the receiver.

The relay R fitted with $R_x$ receive antennas and $T_R$ transmit antennas receives the data $Y_{1R} \in C^{R_x \times N}$ comprising a superposition of code words $Y_{1R} \in C^{R_x \times N}$, $Y_{2R} \in C^{R_x \times N}$ (or at least some of them) as transmitted over the channels CH1, CH2.

Below in this document, the generic term "code words" is used with reference to $X_{S_1}$ and $X_{S_2}$ and more generally for any vector/matrix obtained as a result of coding with a modulation and coding scheme $C_i$.

The code words $Y_{1R}, Y_{2R}$ are thus a disturbed version of the transmitted code words $X_{S_1}, X_{S_2}$ and their superposition may be written in the following form: with k=1, ..., N, $$y_{R,k} = y_{1R,k} + y_{2R,k} \qquad (1)$$

$$= \sum_{m=0}^{M} H_{S_1R,k,m} x_{S_1,k-m} + \sum_{m=0}^{M} H_{S_2R,k,m} x_{S_2,k-m} + n_{SR,k}$$

where: $n_{SR,k} \in C^{R_x}$ designates teh additive noise vector $$H_{S_1R} \in C^{R_X \times T_{S_1}} \text{ and } H_{S_2R} \in C^{R_X \times T_{S_2}}$$

designates the fading coefficient matrices between the two sources and the relay, and M designates the memory of the channel (the memory effect of the channel is associated with the propagation delay or "delay spread"). This delay gives rise to transmitted signals being superposed, which leads to interference between the symbols.

In a step 4, the relay R performs joint detection/decoding of the received data in a manner that may be said to be "hard" or "soft" by means of a joint detector/decoder DET/DEC in order to deduce therefrom the real-value vectors $\lambda_{1R} \in R^K$, $\lambda_{2R} \in R^K$ representative of the binary data from the two sources. The relay stores the real-value vectors $\lambda_{1R}, \lambda_{2R}$.

In a step 5, the relay acts simultaneously on the basis of the two vectors $\lambda_{1R}$ and $\lambda_{2R}$ corresponding to the preceding block to apply a function $\Theta$, as described below, for obtaining redundancy information $X_R = \Theta(\lambda_{1R}, \lambda_{2R}) \in C^{T_R \times N_R}$ that is transmitted in a step 6 by the relay to the receiver over $N_R$ utilizations of the channel (time slots). Under such circumstances, $N_R = N$.

The transmission of the additional code word $X_R$ by the relay is offset relative to the transmission of the code words $X_{S_1}, X_{S_2}$ relating to K information bits. The processing of the code words and of the additional code word $X_R$ by the transmitters and by the relay is sequenced: in a full-duplex relay, the additional code word $X_R$ is transmitted with an offset of one block of K information bits relative to the code words $X_{S_1}$, $X_{S_2}$; the additional code word $X_R$ transmitted over the channel CHRD during $N_R=N$ time slots relates to the code words $X_{S_1}$, $X_{S_2}$ transmitted over the channels CH1D, CH2D during the preceding $N_R=N$ time slots.

This additional code word $X_R$ is transmitted by the relay to the destination D (the receiver). The receiver observes a superposition of transmitted symbols coming from the sources and from the relay, and it uses these superposed symbols, optionally together with those received beforehand and corresponding to one or more preceding blocks of K bits each, in order to recover the messages $u_{S_1}, u_{S_2}$, each relating to one block of K bits. For this purpose, it performs iterative joint detection/decoding.

In various embodiments, the basic topology may be repeated in order to determine a MARC system having several relays and several destinations, each relay being associated with at least two transmitters and a receiver. In other embodiments, the two transmitters of a basic topology may constitute a single transmitter with at least two transmit antennas. Under all circumstances, the relay and the receiver receive code words transmitted via distinct transmission channels.

Each relay R thus provides redundancy code words $X_R$ that enable decoding to be improved at the receiver. These redundancy code words are formed by separating the streams coming from the two transmitters since the code words $Y_{1R}, Y_{2R}$ coming from the two transmitters $S_1, S_2$ are superposed in a common received stream $Y_R$ because of the non-orthogonal links S1→R, S2→R, and by jointly coding the values extracted from the superposed streams.

Numerous variant implementations may be envisaged, as a function of the type of coding, and of code concatenation (parallel, serial, or arbitrary).

Numerous types of code may be used in the transmitters and in the relays, providing they are linear codes. It is possible in particular to make use of:
- convolutional codes;
- BCH codes;
- Reed-Solomon (RS) codes;
- turbo-codes;
- binary or non-binary low-density parity-check (LDPC) codes; and/or
- parity codes.

It is possible to use the same code in the transmitters and in the relays, or else to use different codes.

In a first embodiment, the MARC system shown in FIG. 4 has links CH1, CH2 between the sources S1, S2 and the relay R, which links are assumed to be completely reliable, in other words the links are of very good quality and decoding is practically without error.

Figure 6:
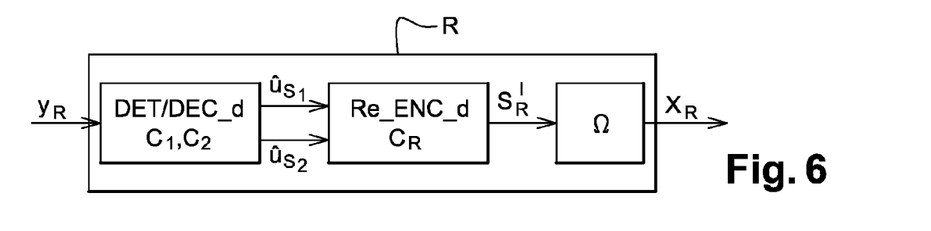
FIG. 6 is a diagram of a first embodiment of a relay of an embodiment of the invention.

The relay R shown in FIG. 6 performs hard decoding on the data from the two sources by means of a hard joint detector/decoder DET/DEC_d and it re-encodes the data jointly using a hard joint coder Re_ENC_d using the modulation and space time coding scheme $C_R$.

The outputs $\hat{u}_{S_1}, \hat{u}_{S_2}$ from the joint detector/decoder DET/DEC_d take binary values that are used by the joint coder Re_ENC_d:

$$\lambda_{1R} = \hat{u}_{S_1} \in F_2^K$$

$$\lambda_{2R} = \hat{u}_{S_2} \in F_2^K$$

The hard joint coder Re_ENC_d makes use of two input vectors of binary values and outputs a matrix of discrete symbols $S_R^1 \in \chi_R^{T_R \times N_1}$ where $\chi_R$ is a complex constellation of cardinality $|\chi_R|=2^m (m \in N)$ by applying the modulation and space time coding scheme $C_R$:

$$C_R: F_2^K \times F_2^K \to \chi_R^{T_R \times N_1}$$

which produces the discrete symbols $S_R^1 \in \chi_R^{T_R \times N_1}$.

Thereafter, a column selection function $\Omega$ is applied:

$$\Omega: \chi_R^{T_R \times N_1} \to \chi_R^{T_R \times N_0}$$

with $N_0 \leq N_1$ thereby selecting $N_0$ columns of the matrix $S^1_R \in \chi_R^{T_R \times N_1}$ in order to obtain the redundancy symbols $S_R \in \chi_R^{T_R \times N_0}$ such that $S_R = \Omega(S^1_R)$.

The relay transmits these discrete symbols, possibly with power weighting, during $N_0 = N_R$ time slots. These discrete symbols $X_R$ may be expressed in the form:

$$X_R = \beta S_R = \Theta(\hat{u}_{S_1}, \hat{u}_{S_2}) \in \chi_R^{T_R \times N_R}$$

where $\beta$ is a power normalization factor and $\Theta$ is a deterministic function of the estimated data from the two sources.

In a second embodiment, the MARC system shown in FIG. 4 has links CH1, CH2 between the sources S1, S2 and the relay R with Rayleigh fading. In addition, the sources have no knowledge of the link between a source and the relay. Consequently, there is a non-zero probability of the relay decoding the messages from the two sources imperfectly. Under such conditions, there is a risk of the relay propagating errors to the destination.

This embodiment makes it possible, at the destination and while performing the joint decoding, to take account of the decoding errors that arose in the relay.

Figure 7:
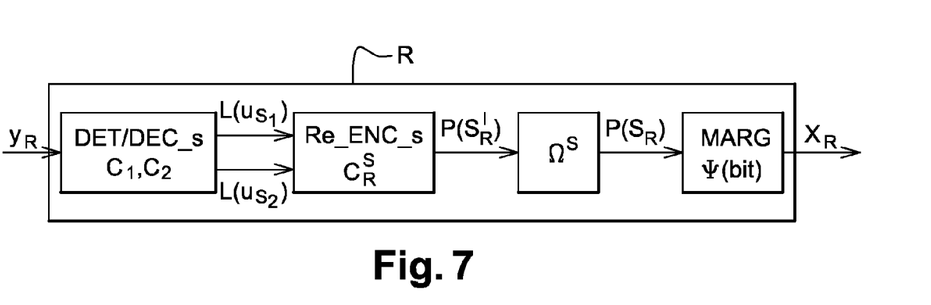
FIG. 7 is a diagram of a second embodiment of a relay of an embodiment of the invention.
Figure 8:
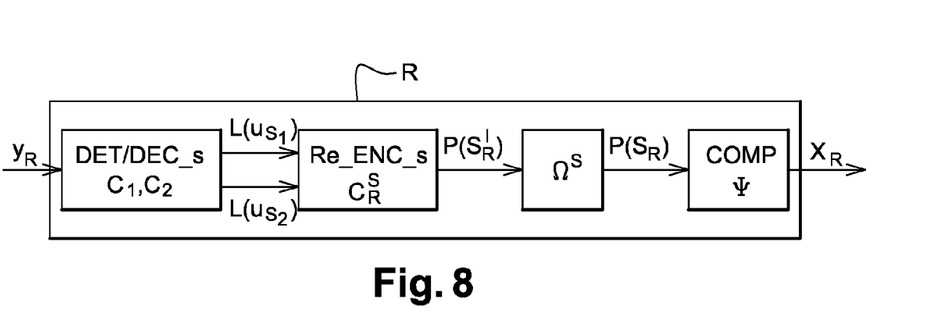
FIG. 8 is a diagram of a third embodiment of a relay of an embodiment of the invention.

In this embodiment, the relay R shown in FIGS. 7 and 8 performs soft joint detection/decoding by means of a soft joint detector/decoder DET/DEC_s in order to obtain the APPs of the information bits ($\{P(u_k=0,1)\}$).

The APPs of the information bits are calculated in the form of a log likelihood ratio (LLR) defined as follows:

$$[\lambda_{1R}]_k = L(u_{S_i,k}) = [L(u_{S_i})]_k = \ln\frac{P(u_{S_i,k}=1)}{P(u_{S_i,k}=0)}$$

$$k=1,\ldots,K \quad i=1,2$$

Thus:

$$\lambda_{1R} = L(u_{S_1}) \in R^K$$

$$\lambda_{2R} = L(u_{S_2}) \in R^K$$

The relay then performs weighted network space-time joint re-encoding using a joint coder Re_ENC_s, described in detail below, on the basis of the following modulation and coding scheme $C_R$:

$$C_R: F_2^K \times F_2^K \to \chi_R^{T_R \times N_1}$$

The encoder uses two vectors of binary values and produces a matrix of discrete symbols $S^1_R$ belonging to $\chi_R^{T_R \times N_1}$ where $\chi_R$ is a complex constellation of cardinality $|\chi_R|=2^m$ (m∈N).

The weighted network space-time encoding function that uses a BCJR algorithm applied to the code $C_R$ is represented in the form:

$$C_R^S: R^K \times R^K \to R^{(|\chi_R|^{T_R}-1) \times N_1}$$

The weighted network encoding function, implemented by the joint coder Re_ENC_s uses two vectors of real values (the vectors of the LLRs of the decoded bits), and it provides $T_R$-dimensional probabilities of the symbols $s_{R,k}^1 \delta^\bullet{}_R^{T_R}$ in the form of $(2^{mT_R}-1)$ LLR:

$$\ln\frac{P(S^1_{R,k} = a_i)}{P(S^1_{R,k} = a_0)}$$

with $a_i \in \bullet{}_R^{T_R}$ and $$\bigcup_{i=0}^{2^{mT_R}-1} \{a_i\} = \chi_R^{T_R},$$

$i=1,\ldots,2^{mT_R}-1, k=1,\ldots,N_1$.
I.e.:

$$P(S^1_R)_{i,k} = \ln\frac{P(S^1_{R,k}=a_i)}{P(S^1_{R,k}=a_0)}$$

defining the matrix $$P(S^1_R) \in R^{(|\chi_R|^{T_R}-1) \times N_1}$$

In the end, the column selection function $\Omega^S$ (which eliminates all of the probabilities relating to the vectors eliminated by the column selection function $\Omega$) is applied to the matrix $$P(S^1_R) \in R^{(|\chi_R|^{T_R}-1) \times N_1}.$$

This thus defines the function:

$$\Omega^S: R^{(|\chi_R|^{T_R}-1) \times N_1} \to R^{(|\chi_R|^{T_R}-1) \times N_0}$$

with $N_0 \leq N_1$ such that $P(S_R) = \Omega^S(P(S_R^1))$

The relay shown in FIG. 7 corresponds to a particular embodiment in which the joint re-encoding is followed by marginalization MARG before transmitting the redundancy information.

This particular mode is adapted for a relay in which the modulation and space-time coding scheme $C_R$ is based on a binary coding function (possibly including an interleaver): $C: F_2^K \times F_2^K \to F_2^{N_1 \times T_R \times m}$ and on modulation (a bit to symbol coding function) associating bits with symbols $\phi_R: F_2^m \to \chi_2 \subseteq C$ (where $\subseteq$ means "subset of"), where $\chi_R$ denotes the constellation of symbols obtained of cardinality $|\chi_R|=2^m$, i.e. $s_{R,k,t}^1 = \phi_R(c_{R,k,t(1)}^1, \ldots, c_{R,k,t(m)}^1)$. An example of this coding and space-time modulation scheme is space time bit interleaved coded modulation (ST-BICM).

The marginalization operation $\Psi$ consists in calculating bit probabilities from symbol probabilities $P(S_{R,k})$ stored in the form $P(S_R)_{i,k}$ in order to provide logarithms for an APP ratio.

Assuming that $C_R \in F_2^{N_0 \times T_R \times m}$ is the binary redundancy information, $c_{R,k,t(l)} = \phi_{R(l)}^{-1}(s_{R,k,t})$ denotes the $l^{th}$ bit of the symbol $s_{R,k,t}$ ($k=1,\ldots,N_0, l=1,\ldots,m, t=1,\ldots,T_R$). Applying the marginalization function $\Psi$ described by the expression $$\Psi: R^{(|\chi_R|^{T_R}-1) \times N_0} \to R^{T_R \times m \times N_0}$$

makes it possible to obtain the LLRs $L(c_{R,k,t(l)})$ of the bits $c_{R,k,t(l)}$:

$$L(c_{R,k,t(l)}) = \ln\left(\frac{P(c_{R,k,t(l)} = 1)}{P(c_{R,k,t(l)} = 0)}\right)$$

from the probabilities:

$$P(c_{R,k,t(l)} = b) = \sum_{a \in \chi_R^{T_R}: \varphi_l^{-1}(a_t)=b} P(s_{R,k} = a) \quad b=0,1$$

where:
$P(s_{R,k}=a_i)=c_0 e^{P(s_R)_{i,k}}$ i=1, ..., $2^{mT_R}-1$ with $$c_0 = P(s_{R,k} = a_0) = \frac{1}{1 + \sum_{i=1}^{2^{mT_R}-1} e^{P(s_R)_{i,k}}}$$

With the matrix $L(c_R) \in R^{T_R \times mN_0}$ defined as follows:

$[L(c_R)]_{t,(k-1)m+l} = L(c_{R,k,t(l)}) k=1, \ldots, N_0, t=1, \ldots, T_R, l=1, \ldots, m$ then the redundancy information $X_R = \beta L(c_R)$ is transmitted to the receiver during $N_R = mN_0$ time slots ($N_R = mN_0/2$ if the method uses the quadrature channel and the in-phase channel) where $\beta$ is a power normalization factor.

This particular embodiment is applicable to all kinds of modulation, however since the relay transmits soft values corresponding to the bits in the form of LLRs, the spectrum efficiency is limited to that available for BPSK modulation (or QPSK modulation).

The relay shown in FIG. 8 corresponds to a particular embodiment in which the joint re-encoding is followed by compression COMP prior to transmitting the redundancy information. The compression function $\Psi$ may be written in the following form:

$$\Psi: R^{(|\chi_R|^{T_R}-1) \times N_0} \to C^{T_R \times N_0}$$

The operation of compressing the probability distribution has the advantage of enabling all of the soft information to be transmitted relating to the probabilities of a symbol as provided by the encoder over a single time slot, regardless of the modulation of the modulation and coding scheme $C_R$.

Figure 9:
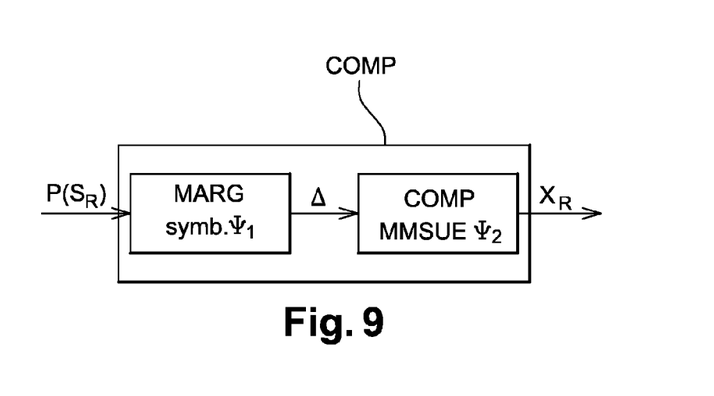
FIG. 9 is a diagram of an example of compression implemented in the relay.

The following example corresponds to the special circumstance MMSUE compression. The scheme for the operations performed in the relay in order to implement MMSUE compression is shown in FIG. 9.

The marginalization function $\Psi_1$ performed on the symbols and represented by:

$$\Psi_1: R^{(|\chi_R|^{T_R}-1) \times N_0} \to R^{T_R \times (|\chi_R|-1) \times N_0}$$

makes use of the LLR vectors $$P(s_R) \in R^{(|\chi_R|^{T_R}-1) \times N_0}$$

and it provides the LLRs $\Delta_{t,j,k}$.
Let:

$\Delta \in R^{T_R \times (|\chi_R|-1) \times N_0}$ with $\Delta_{t,j,k} = \ln \frac{P(s_{R,k,t} = b_j)}{P(s_{R,k,t} = b_0)}$ $b_j \in \chi_R, \bigcup_{i=0}^{2^m-1} \{b_j\} = \chi_R$ with j=1, ..., $2^m-1$, k=1 ... $N_0$, t=1, ..., $T_R$ and where:

$$P(s_{R,k,t} = b_j) = \sum_{i:a_{i,t}=b_j} P(s_{R,k} = a_i) = \sum_{i:a_{i,t}=b_j} c_0 e^{P(s_R)_{i,k}}$$

$b_j \in \chi_R$, j=0, ..., $2^m-1$, i=1, ..., $2^{mT_R}-1$, $$c_0 = P(s_{R,k} = a_0) = \frac{1}{1 + \sum_{i=1}^{2^{mT_R}-1} e^{P(s_R)_{i,k}}}$$

This marginalization function may be incorporated directly in the soft re-encoding/modulation step.

The MMSUE compression function $\Psi_2$ consists in calculating the expectation of the symbols $s_{R,k,t}$, and it is written in the form:

$\Psi_2: R^{T_R \times (|\chi_R|-1) \times N_0} \to C^{T_R \times N_0}$

It makes use of the LLRs $\Delta_{t,j,k}$ and it calculates:

$$E(s_{R,k,t}) = \sum_{j=0}^{|\chi_R|-1} b_j P(s_{R,k,t} = b_j) = \sum_{j=0}^{|\chi_R|-1} b_j K_0 e^{\Delta_{t,j,k}}$$

$b_j \in \chi_R$, j=0, ..., $2^m-1$, $$K_0 = P(s_{R,k,t} = b_0) = \frac{1}{1 + \sum_{j=1}^{|\chi_R|-1} e^{\Delta_{t,j,k}}},$$

$\Delta_{t,0,k} = 0$

The calculated expectations $E(s_{R,k,t})$ are stored in a matrix $E(s_R) \in C^{T_R \times N_0}$ and the redundancy information $X_R = \beta E(s_R)$ is sent to the destination over $N_R = N_0$ utilizations of the channel, where $\beta$ is a power normalization factor.

In the description below of a particular embodiment of a relay, the sources S1, S2 (the transmitters) are assumed to implement bit interleaved coded modulation (BICM) modulation and coding schemes, i.e. these schemes comprise serial concatenation of a binary encoder, a bit-to-bit interleaver (referred to as the interleaver of the channel), and a modulator. The transmitters under consideration thus include bit-level pseudo-random interleavers prior to transmitting the signals. Consequently, both the relay and the receiver include the corresponding de-interleavers. The interleavers are used to break the correlation between consecutive transmitted bits, thereby enabling iterative joint detection/decoding to be performed more effectively.

In order to simplify the notation, it is assumed below that a single transmit antenna and a single receive antenna are used in all of the transmitters and receivers, i.e. $T_{S_1} = T_{S_2} = R_X = 1$. Furthermore, it is assumed that Rayleigh fading is quasi-static, that the channel does not have any memory, and that the receivers have perfect knowledge of the variance of the noise and of the fading coefficients.

The coding schemes corresponding to the two sources associate each message vector $u_{S_1} \in F_2^K$ and $u_{S_2} \in F_2^K$ with coded bits $c_{S_1} \in F_2^{n_1}$ and $c_{S_2} \in F_2^{n_2}$ ($n_1$ and $n_2$: coded bit lengths) that are interleaved to give $V_{S_1} \in F_2^{N \times p}$ and $V_{S_2} \in F_2^{N \times q}$ and then modulated (using the modulation schemes of the two sources) in symbols (code words) $x_{S_1} \in \chi_1^N$ and $x_{S_2} \in \chi_2^N$ that belong to a complex constellation. Assuming that the labels used are $\phi_1: F_2^p \to \chi_1 \subseteq C$ and $\phi_2: F_2^q \to \chi_2 \subseteq C$, where each modulated symbol of $S_1$ and of $S_2$ belongs respectively to the complex sets $\chi_1$ and $\chi_2$ of cardinalities $|\chi_1|=2^p$ and $|\chi_2|=2^q$, then $v_{S_i,k(l)} = \phi_{i(l)}^{-1}(x_{S_i,k})$ denotes the $l^{th}$ bit of the binary label of $x_{S_i,k}$ (k=1, ..., N, l=1, ..., p for $S_1$ and l=1, ..., q for $S_2$).

The coding and modulation scheme $C_R$ corresponding to the relay is based on a binary code $F_2^K \times F_2^K \to F_2^n$ (the vector of the coded bits of the redundancies is written $c_R$, $c_R \in F_2^{n'}$, n'<n), an interleaver (the coded and interleaved bits are written $V_R \in F_2^{N_R \times m}$), and a modulator with bit to symbol coding $\phi_R: F_2^m \to \chi_R \subseteq C$, where $\chi_R$ denotes the constellation of symbols that is obtained of cardinality $|X_R|=2^m$. The signal (code word) transmitted by the relay is written $x_R \in C^{N_R}$.

The operation of the relay is described in greater detail below.

Figure 10:
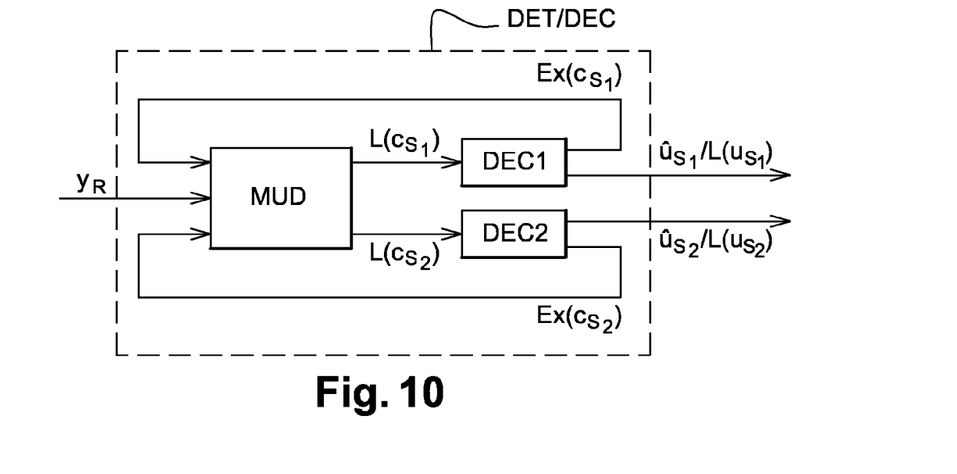
FIG. 10 is a detailed diagram of a joint detector/decoder DET/DEC of a relay as shown in FIG. 6, 7, or 8.

The joint detector/decoder DET/DEC is shown in FIG. 10. The description applies equally well to situations in which the decision-taking of the joint detector/decoder is hard or soft.

The joint detector/decoder DET/DEC applies a joint detection/decoding scheme in iterative manner. The scheme is implemented by a multiuser detector MUD followed by two decoders DEC1 and DEC2 in parallel.

The relay R receives a superposition of the signals from the two sources S1, S2 as expressed by equation (1), which can be simplified when the number of source transmit antennas and the number of relay receive antennas are both equal to one; when there is quasi-static Rayleigh fading; and when the channel is memory-free:

$$y_{R,k} = y_{1R,k} + y_{2R,k} \quad (2)$$
$$= h_{S_1R} x_{S_1,k} + h_{S_2R} x_{S_2,k} + n_{SR,k}$$
$$k = 1, \ldots, N$$

where $n_{SR,k}$ designates the Gaussian additive noise having the distribution $CN(0, \sigma_n^2)$ and where $h_{S_1R}$ and $h_{S_2R}$ designate the coefficients of the links between the respective sources S1, S2 and the relay R.

Figure 11:
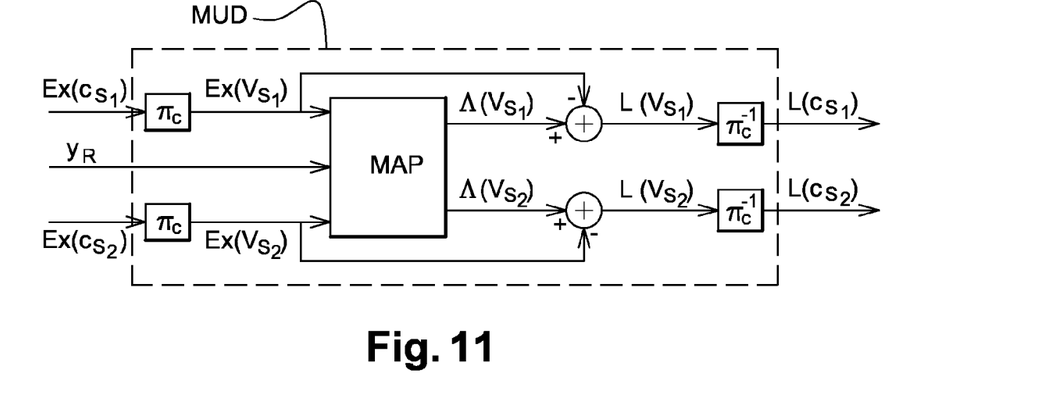
FIG. 11 is a detailed diagram of an MUD of a joint detector/decoder DET/DEC shown in FIG. 10.

At each iteration, the multiuser detector MUD, shown diagrammatically in FIG. 11, separates the streams from the received data $y_R$, extracts the information from each of the sources by implementing a maximum a posteriori detector MAP. The detector MAP calculates the soft information of the coded bits from the two sources in the form of a logarithmic likelihood ratio (LLR) $\{L(c_{S_1})\}$ and $\{L(c_{S_2})\}$ by making use of the noisy observation from the channel $y_R$ and the a priori information about the coded and interleaved bits $\{Ex(V_{S_1})\}$ and $\{Ex(V_{S_2})\}$ provided by the decoder DECi at the preceding iteration.

The logarithmic likelihood ratio (LLR) of an $l^{th}$ bit of a symbol from each source $v_{S_i(l)} = \phi_{i(l)}^{-1}(x_{S_i})$ is calculated using the following equations, in which, in order to simplify notation time indices are omitted:

$$\Lambda(v_{S_i(l)}) = \log \frac{P(v_{S_i(l)} = 1 | y_R)}{P(v_{S_i(l)} = 0 | y_R)} \quad (3)$$

$$= \log \frac{\sum_{x_i \in \chi_i : \varphi_{i(l)}^{-1}(x_i)=1} \sum_{x_j \in \chi_j} p(y_R | x_{S_i} = x_i, x_{S_j} = x_j) e^{\xi(x_i)+\xi(x_j)}}{\sum_{x_i \in \chi_i : \varphi_{i(l)}^{-1}(x_i)=0} \sum_{x_j \in \chi_j} p(y_R | x_{S_i} = x_i, x_{S_j} = x_j) e^{\xi(x_i)+\xi(x_j)}}$$

$(i, j = 1, 2 \text{ and } i \neq j)$

Knowing the Gaussian distribution of the noise, this makes it possible to write:

$$\Lambda(v_{S_i(l)}) = \quad (4)$$

$$\log \left( \frac{\sum_{x_i \in \chi_i : \varphi_{i(l)}^{-1}(x_i)=1} \sum_{x_j \in \chi_j} \exp\left(-\frac{\|y_R - h_{S_iR}x_i - h_{S_jR}x_j\|^2}{\sigma_n} + \xi(x_i) + \xi(x_j)\right)}{\sum_{x_i \in \chi_i : \varphi_{i(l)}^{-1}(x_i)=0} \sum_{x_j \in \chi_j} \exp\left(-\frac{\|y_R - h_{S_iR}x_i - h_{S_jR}x_j\|^2}{\sigma_n} + \xi(x_i) + \xi(x_j)\right)} \right)$$

Where:

$$\xi(x_i) = \sum_{l'=1}^{\log_2 |\chi_i|} \varphi_{i(l')}^{-1}(x_i) Ex(v_{S_i(l')}) \quad (5)$$

$$\xi(x_j) = \sum_{l'=1}^{\log_2 |\chi_j|} \varphi_{j(l')}^{-1}(x_j) Ex(v_{S_j(l')}) \quad (6)$$

$(i, j = 1, 2, i \neq j \text{ and } l' \neq l)$

Where $\{Ex(v_{S_i(l)})\}$ are the a priori logarithmic likelihood ratios for the bits of each symbol, as provided by the decoder on the preceding iteration.

The extrinsic logarithmic likelihood ratios (LLR) at the outlet from the detector MAP are calculated using:

$$L(v_{S_i(l)}) = \Lambda(v_{S_i(l)}) - Ex(v_{S_i(l)}) \quad (7)$$

After de-interleaving performed by a de-interleaver $\pi_c^{-1}$, which performs the inverse function to the interleaver used on transmission in association with the channel coding, the MUD provides the extrinsic logarithmic likelihood ratios (LLR) for the coded bits $L(C_{S_i})$.

Figure 12:
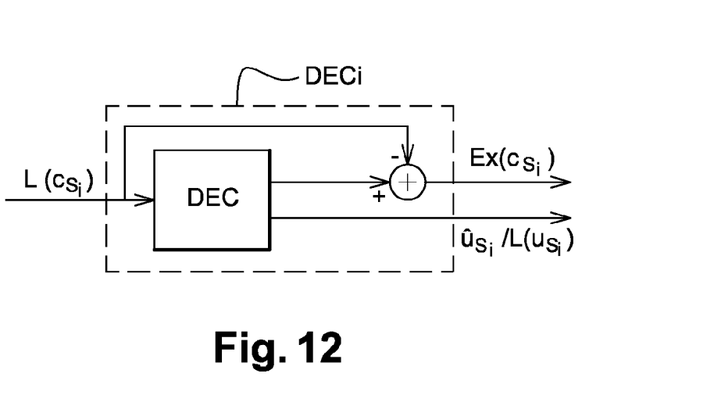
FIG. 12 is a detailed diagram of a decoder DECi of a joint detector/decoder DET/DEC shown in FIG. 10.

On each iteration, the decoders DECi, shown diagrammatically in FIG. 12, make use respectively of the vectors of the intrinsic logarithmic likelihood ratios (LLR) of the coded bits $\{L(C_{S_1})\}$ and $\{L(C_{S_2})\}$ provided by the MUD. They deliver extrinsic logarithmic likelihood ratios $\{Ex(c_{S_1})\}$ and $\{Ex(c_{S_2})\}$ for the coded bits $c_{S_1}$ and $c_{S_2}$. After interleaving, the extrinsic logarithmic likelihood ratios $Ex(V_{S_1})$ and $Ex(V_{S_2})$ of the coded and interleaved bits are used in the following iteration by the MUD as a priori logarithmic likelihood ratio. The interleaver is identical to that used on transmission in association with the channel coding.

At the last iteration, each decoder DECi takes a hard/soft decision and provides a vector $\hat{u}_{S_i}/L(u_{S_i})$ representative of K information bits $u_{S_i}$.

In full-duplex mode, at the same time as the relay is detecting/decoding the received block, it sends to the receiver the signal it has deduced from the preceding block. Consequently, the destination observes a superposition of information coming from the two sources and of the coded information of the preceding block coming from the relay. This is a general coding scheme that is used in the relay channels, i.e. coding with superposition of the Markov block.

The signal received at the destination D contains information coming from the relay about the preceding information block, so the processing on reception must be capable of using a plurality of successive blocks jointly. The received signal may be expressed in the form:

$$y^i_{D,k} = h^i_{S_1D} x^i_{S_1,k} + h^i_{S_2D} x^i_{S_2,k} + h^i_{RD} x^i_{R,k} + n^i_k \quad (8)$$
$$k = 1, \ldots, N$$
$$i = 0, \ldots, B$$

where B designates the number of information blocks under consideration (B blocks, each corresponding to K bits of information), $x_{S_1}^i$ and $x_{S_2}^i$ are the modulated code words transmitted respectively by the sources S1 and S2 and corresponding to the information words $u^i_{S_1}$ and $u^i_{S_2}$, and $x^i_R$ is a redundancy vector transmitted by the relay relating to the preceding messages $u^{i-1}_{S_1}$ and $u^{i-1}_{S_2}$.

Figure 13:
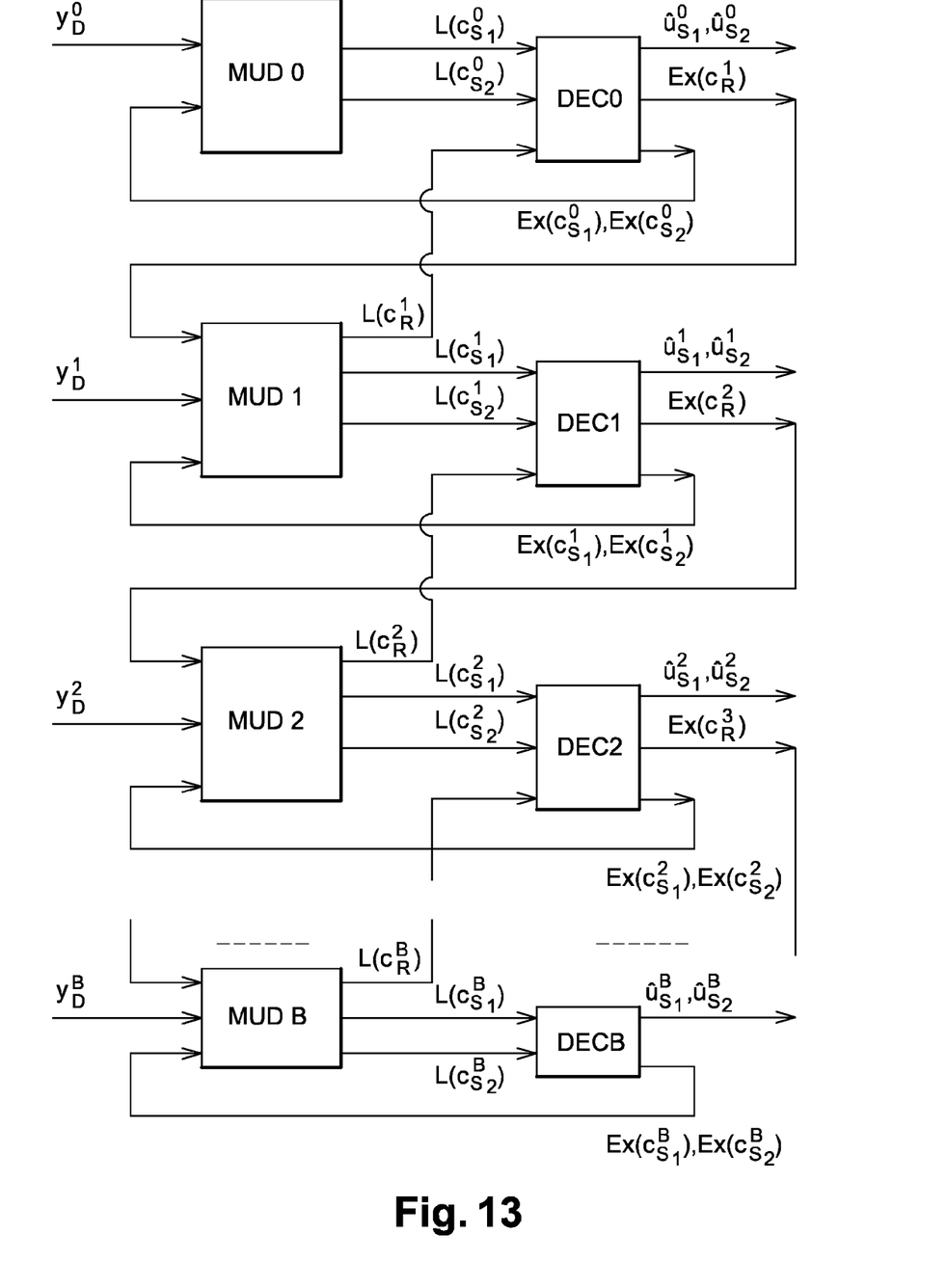
FIG. 13 is a diagram of an iterative joint decoding algorithm implemented in a receiver of a MARC system having a full-duplex relay of an embodiment of the invention.

After receiving B+1 blocks, the receiver D detects and decodes information from the two sources using an iterative joint detection/decoding algorithm. This algorithm is shown in FIG. 13. For reasons of simplicity, the interleavers of the channel are not shown.

The B+1 multi-user detectors MUDi make it possible to obtain the LLRs of the received code words coming from the two sources and from the relay. These LLRs are used by the B+1 decoders DECi.

The $i^{th}$ decoder DECi receives as input the intrinsic logarithmic likelihood ratios of the coded bits $\{L(c^i_{S_1})\}$, $\{L(c^i_{S_2})\}$, and $\{L(c^{i+1}_R)\}$ as provided by MUD i and MUD i+1, and it determines the extrinsic logarithmic likelihood ratios $\{Ex(c^i_{S_1})\}$, $\{Ex(c^i_{S_2})\}$, and $\{Ex(c^{i+1}_R)\}$ for the coded bits $c^i_{S_1}, c^i_{S_2}$, and $c^{i+1}_R$. After interleaving, these values are used as inputs to the same MUDs as a priori values. The last block is processed a little differently, since no redundancy vector has been determined for this block by the relay.

Determining the number of blocks B taken into consideration depends on how the MARC system is implemented.

In a first implementation, the sources S1 and S2 transmit a frame of B+1 blocks. The B+1$^{th}$ block does not benefit the destination of the network coding. This block is decoded with quality that is not as good as the quality with which the other B blocks are decoded. The ratio of the number of blocks having degraded performance is 1/B+1, so performance is improved for greater values of B. It is therefore advantageous to determine a number B that is as large as possible in order to minimize the loss of quality on decoding. However, the greater the number B, the greater the increase in the complexity of the processing on reception.

In a second implementation, each source transmits its information in a frame of B consecutive blocks (B0, . . . , B−1), each block lasting for N time slots. The receiver decodes these blocks jointly after receiving the redundancy code word transmitted by the relay in respect of the block B−1. Sequencing is such that the block B0 is transmitted in the absence of simultaneous transmission by the relay of a redundancy code word, and the redundancy code word relating to the block B−1 is transmitted by the relay in the absence of simultaneous transmission by the sources. The advantage of this implementation is that all of the decoded blocks benefit from network coding, but this is to the detriment of spectrum efficiency corresponding to the ratio B/B+1 since the transmission of the last redundancy vector relating to the blocks B−1 by the relay must correspond to a non-transmission or silent interval (guard interval) that is imposed on the two sources. The greater B, the closer this ratio approaches unity, but the amount of processing on reception is made more complex.

The value of B is thus the result of a compromise between decoding performance and complexity.

The description below relates to an implementation of the transmission method and of a reception method of an embodiment of the invention, in a particular MARC system.

The MARC system has a full-duplex relay that implements a specific coding/decoding scheme of the distributed turbo-code type. The two sources encode data in blocks of length K using the same type of RSCC (Recursive Systematic Convolutional Code) coder of rate ½ and they transmit the systematic bits and the parity bits to the relay and to the destination (receiver). Under such circumstances: N=2K.

Figure 14:
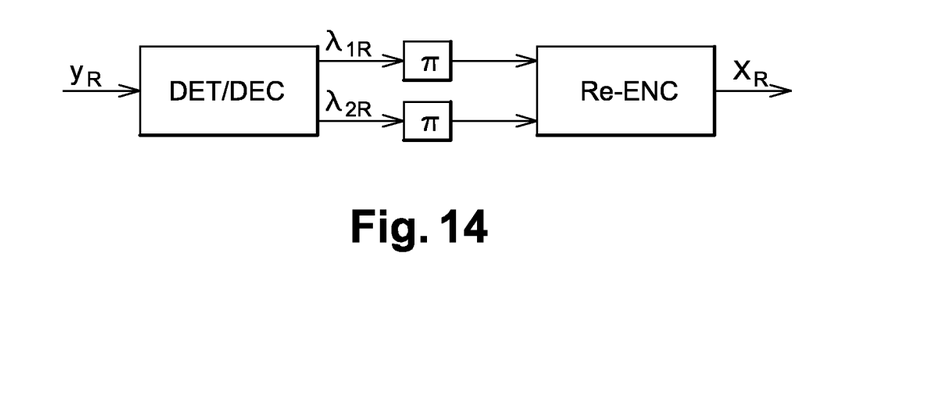
FIG. 14 is a diagram showing the sequencing of operations in the relay of an embodiment of the invention.

At the same time as the relay receives the streams, it transmits additional parity sequences to the receiver, which sequences correspond to the preceding block. For this purpose, it uses an interleaver Π to interleave the decoded streams of the preceding block, it re-encodes them jointly with an RSCC with a rate of 2/4, and it transmits only the parity bits. This determination is shown in FIG. 14.

Thus, the destination has two distributed turbo-codes (DTC) of rate 1/4, which are thus very powerful, for decoding information packets $u^{i-1}_{S_1}$ and $u^{i-1}_{S_2}$ at instant i.

The relay implements processing in accordance with the third implementation described above with reference to FIG. 8: the relay makes soft decisions during decoding and during re-encoding, and it compresses probability distributions at the outlet from the soft encoder by calculating the mathematical expectation of the symbols.

At the destination, the reception method applies a Gaussian model to model the total disturbance on the received signal coming from the relay.

In order to maximize the SNR at the destination, the MARC system uses an MMSUE criterion: the relay makes an optimum estimate on the basis of a posteriori probabilities. The criterion selected serves to optimize the role of the relay. The principle of the MMSUE compression performed by the relay is as follows.

The relay generates probabilities concerning the symbols $s_{R,k}$ belonging to the constellation $\chi_R$:
$\phi_R: F_2^m \rightarrow \chi_R \subseteq \mathbb{C}$ the complex set $\chi_R$ of cardinality $|\chi_R|=2^m$. Thus, $v_{R,k(l)} = \phi_{R(l)}^{-1}(s_{R,k})$, k=1, $N_R$, l=1, . . . , m denotes the $l^{th}$ bit of the binary label of $s_{R,k}$. The energy of the symbols is normalized to 1 in order to simplify the notation.

The relay transmits information about the packets from the nodes $S_1$ and $S_2$ which information is encoded and modulated using $C_R$ over $N_R$ time slots. The following complex symbols are transmitted by the relay during the $N_R$ time slots:

$$x_{R,k} = f(s_{R,k}) = \sqrt{\frac{P_R}{\sigma^2_{\tilde{s}_{R,k}}}} \tilde{s}_{R,k}, \quad k = 1, \ldots, N_R \quad (9)$$

with $$\tilde{s}_{R,k} = \sum_{a \in \chi_R} s_{R,k} P(s_{R,k} = a) \quad (10)$$

and $$\sigma^2_{\tilde{s}_R} = \frac{1}{N_R} \sum_{k=1}^{N_R} |\tilde{s}_{R,k}|^2 \quad (11)$$

where $P_R$ is the energy available to the relay.

At the receiver, in the special circumstance of an interference-free Gaussian channel, the symbols $x_{R,k}$ are detected in the mean squared error sense in order to obtain the estimates $\hat{x}_{R,k} = x_{R,k} + n_k$ where $n_k$ is assumed to be Gaussian and of known variance $\sigma^2$, in a first Gaussian approximation.

By generalizing the MMSUE concept to coded data, the estimates $\hat{x}_{R,k}$ may be expressed in the following form:

$$\hat{x}_{R,k} = x_{R,k} + n_k \quad (12)$$

$$= \frac{\sigma_{\tilde{s}_R}}{\sigma_{\tilde{s}_R}^2}\sqrt{P_R}\,(s_{R,k} + e_k) + n_k$$

$$= \sigma_{\tilde{s}_R}\sqrt{P_R}\,s_{R,k} + \sigma_{\tilde{s}_R}\sqrt{P_R}\,e_k + n_k$$

$$= \sigma_{\tilde{s}_R}\sqrt{P_R}\,s_{R,k} + n'_k$$

the variance of $n_k'$ being $\sigma^2 + P_R(1-\sigma_{\tilde{s}_R}^2)$.

A second Gaussian approximation over $n_k'$ serves to recover the probabilities $P(s_{R,k}=a)$, $a \in \chi_R$, which are proportional to:

$$e^{-\frac{|\hat{x}_{R,k} - \sigma_{\tilde{s}_R}\sqrt{P_R}\,s_{R,k}|^2}{\sigma^2 + P_R(1-\sigma_{\tilde{s}_R}^2)}} \quad (13)$$

By assumption, the nodes of the distributed network are assumed to know their respective transmission powers.

For each block i, the receiver uses a MAP detector to separate the three streams and calculate the logarithmic likelihood ratios for the coded bits. The principle on which a MAP detector operates is described with reference to FIG. 11 for separating two streams. It needs to be adapted in order to separate three streams. In addition, the MMSUE compression needs to be taken into consideration in the calculation. The signal received by the receiver is expressed in the form:

$$y_{D,k}^i = h_{S_1D}^i x_{S_1,k}^i + h_{S_2D}^i x_{S_2,k}^i + h_{RD}^i x_{R,k}^i + n_k^i \quad (14)$$

$$= h_{S_1D}^i x_{S_1,k}^i + h_{S_2D}^i x_{S_2,k}^i + h_{RD}^i (\sigma_{\tilde{s}_R}\sqrt{P_R}\,(s_{R,k}^i + e_k^i)) + n_k^i$$

$$= h_{S_1D}^i x_{S_1,k}^i + h_{S_2D}^i x_{S_2,k}^i + h_{RD}^i \sigma_{\tilde{s}_R}\sqrt{P_R}\,s_{R,k}^i + n_k'^i$$

$$i = 0, \ldots, B, k = 1, \ldots, 2K$$

where:

$$n_k'^i = h_{RD}^i \sigma_{\tilde{s}_R}\sqrt{P_R}\,e_k^i + n_k^i \quad (15)$$

is the equivalent noise at the destination having a mean of zero and variance $\sigma_{n'}^2$:

$$\sigma_{n'}^2 = \sigma_n^2 + P_R|h_{RD}^i|^2(1-\sigma_{\tilde{s}_R}^2) \quad (16)$$

For each block i, the output from the multi-user detector MUD corresponding to the stream coming from the relay may be expressed in the following form, in which, in order to simplify notation, time indices have been omitted:

$$\Lambda(v_{R(l)}^i) = \log(A/B) \quad (17)$$

with:

$$A = \sum_{s_R \in \chi_R : \varphi_{R(l)}^{-1}(s_R)=1} C \quad (18)$$

$$C = \sum_{x_1 \in \chi_1, x_2 \in \chi_2} \exp \quad (19)$$

$$\left( -\frac{\left\| y_D^i - \sum_{j=1}^{2} h_{S_jD}^i x_j - h_{RD}^i \sigma_{\tilde{s}_R}\sqrt{P_R}\,s_R \right\|^2}{\sigma_{n'}^i} + \sum_{j=1}^{2}\xi(x_j) + \xi(s_R) \right)$$

$$B = \sum_{s_R \in \chi_R : \varphi_{R(l)}^{-1}(s_R)=0} C \quad (20)$$

where:

$$\xi(x_j) = \sum_{l'=1}^{\log_2|\chi_j|} \varphi_{j(l')}^{-1}(x_j) Ex(v_{S_j(l')}^i) \quad (21)$$

$$\xi(s_R) = \sum_{l'=1}^{\log_2|\chi_R|} \varphi_{R(l')}^{-1}(s_j) Ex(v_{R(l')}^i) \quad (22)$$

From which the extrinsic LLR comes from the output of the MAP of detector i:

$$L(v_{R(l)}^i) = \Lambda(v_{R(l)}^i) - Ex(v_{R(l)}^i) \quad (23)$$

After de-interleaving, the values $L(c_R^i)$ are obtained at the output from the detector MUDi.

The detector MUDi acts in identical manner to obtain the extrinsic logarithmic likelihood ratios (LLRs) for the coded bits of each symbol corresponding to the streams coming from the sources $L(c_{S_1}^i)$ and $L(c_{S_2}^i)$.

Figure 15:
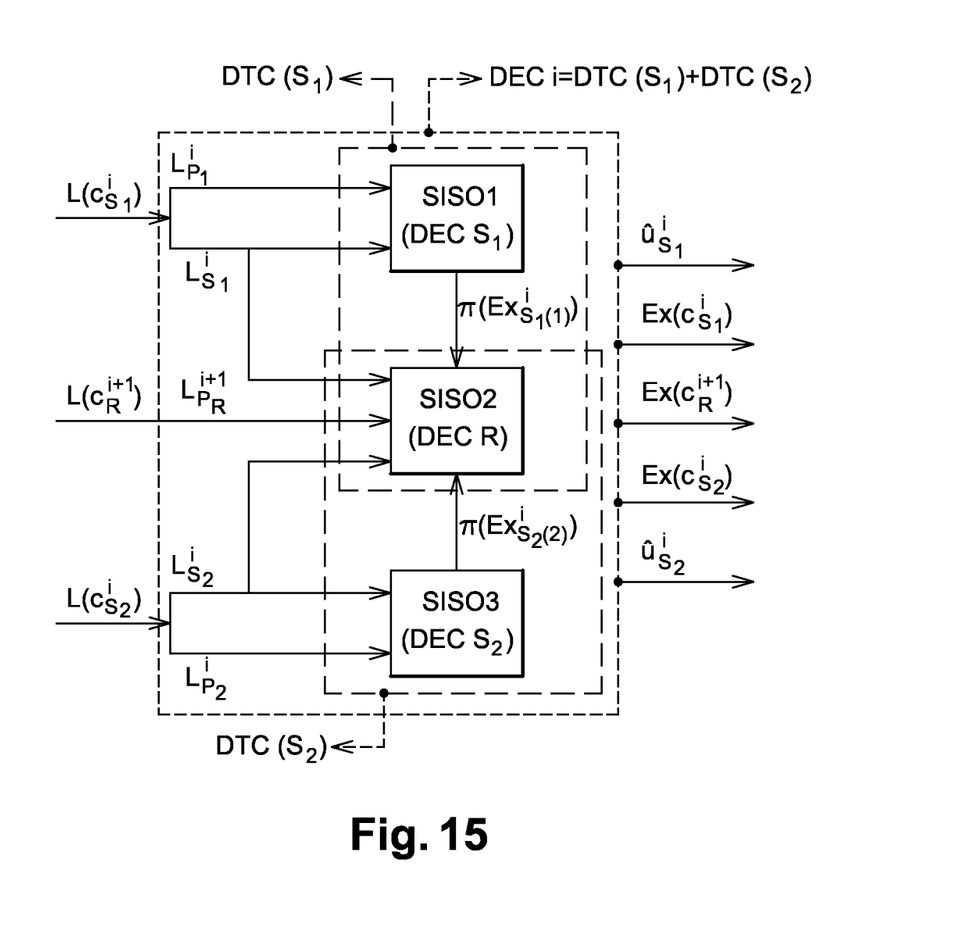
FIG. 15 is a diagram of a decoder implemented in a receiver of a MARC system having a full-duplex relay of an embodiment of the invention.

The principle of joint detection/decoding is illustrated in detail in FIG. 15 from which the a priori information coming from iteration i−1 has been omitted. This scheme shows the DECi in detail, where the DECi is made up of three decoders having soft inputs and soft outputs (SISO).

Let $L_{S_j}^i$ be the soft information about the systematic bits of the two sources, and $L_{P_j}^i$, $L_{P_R}^{i+1}$ be the soft information about the parity bits corresponding to the two sources and to the relay as provided by the detectors MUD i and MUD i+1 (j=1,2).

Let $Ex_{S_j(k)}^i$, $Ex_{P_j(k)}^i$, and $Ex_{P_R(k)}^{i+1}$ be the extrinsic information generated by the decoders having soft inputs and soft outputs, SISO k (k=1, . . . , 3).

In the implementation described, all of the decoders MUDi are implemented in parallel as are the decoders DECi as shown in FIG. 13. The modules of a detection/decoding pair comprise one MUDi and one decoder DECi operating in series, and they exchange soft information within a pair and between pairs as follows:

1) The detectors MUDi determine the intrinsic logarithmic likelihood ratios by using the a priori information coming from the B+1 decoders DECi. Two consecutive detectors MUD i and MUD i+1 participate in decoding the block i of each source. These MUDs use as respective inputs (after re-interleaving) $Ex_{S_1(1)}^i + \Pi^{-1}(Ex_{S_1(2)}^i)$, $Ex_{P_1(1)}^i$, $Ex_{S_2(3)}^i + \Pi^{-1}(Ex_{S_2(2)}^i)$, $Ex_{P_2(3)}^i$, and $Ex_{P_R(2)}^{i+1}$ as a priori values coming from the decoder DECi, with $\Pi^{-1}(.)$ being the output from a de-interleaver of the relay.

2) The B+1 decoders DECi comprise three soft input and soft output decoders SISO1, SISO2, and SISO3. The decoders SISO1 and SISO2 form a first distributed turbo-decoder DTC ($S_1$) and the decoders SISO2 and SISO3 form a second distributed turbo-decoder DTC ($S_2$). The decoders DECi operate in parallel. The calculation method implemented by a decoder DECi, as shown in FIG. 15, takes place iteratively, and per iteration, the operation is as follows:

the decoder DECi uses as input the LRRs $\{L(c^i_1)\}$, $\{L(c^i_2)\}$, and $\{L(c^{i+1}_R)\}$ from the detectors MUDi and MUDi+1; and the decoders SISO1 and SISO3 operate simultaneously:

SISO1 uses as inputs of a priori information $L^i_{S_1}$, $L^i_{P_1}$ and $\Pi^{-1}(Ex^i_{S_1(2)})$ obtained during the preceding iteration, and it calculates $Ex^i_{S_1(1)}$ and $Ex^i_{P_1(1)}$, by means of a BCJR algorithm;

SISO3 uses as inputs of a priori information $L^i_{S_2}$ and $L^i_{P_2}$ and $\Pi^{-1}(Ex^i_{S_2(2)})$ obtained during the preceding information, and it calculates $Ex^i_{S_2(3)}$ and $Ex^i_{P_2(3)}$ by means of a BCJR algorithm; and SISO2 uses $L^i_{S_1}$, $L^i_{S_2}$, and $L^{i+1}_{P_R}$, $\Pi(Ex^i_{S_2(3)})$ and $\Pi(Ex^i_{P_2(1)})$ as inputs of a priori information, and it calculates $Ex^i_{S_1(2)}$, $Ex^i_{S_2(2)}$, and $Ex^{i+1}_{P_R(2)}$ means of a BCJR algorithm.

After a few iterations, the decoders DECi make hard decisions for each block i;

$$L^i_{S_1} + Ex^i_{S_1(1)} + \Pi^{-1}(Ex^i_{S_1(2)})$$

and $$L^i_{S_2} + Ex^i_{S_2(3)} + \Pi^{-1}(Ex^i_{S_1(2)})$$

in order to provide $\hat{u}_{S_1}^i$ and $\hat{u}_{S_2}^i$. respectively.

In a particular use, the two sources correspond to two different users, e.g. two mobile terminals. In another use, the two sources may correspond to two different services that are accessible from a single terminal, but under such circumstances the terminal is fitted with at least two antennas that determine two different propagation channels between the terminal and the relay and between the terminal and the destination.

REFERENCES

[1] C. Hausl, F. Schrenckenbach, I. Oikonomidis, G. Bauch, "Iterative network and channel coding on a Tanner graph," Proc. Annual Allerton Conference on Communication, Control and Computing, Monticello, Ill., 2005.

[2] C. Hausl, P. Dupraz, "Joint Network-Channel Coding for the Multiple-Access Relay Channel," Proc. IEEE SECON'06, Reston, Va., September 2006.

[3] S. Yang, R. Koetter, "Network coding over a noisy relay: A belief propagation approach", Proc. IEEE ISIT'07, Nice, France, June 2007.

[4] L. Bahl, J. Cocke, F. Jelinek, and J. Raviv, "Optimal Decoding of Linear Codes for minimizing symbol error rate", IEEE Transactions on Information Theory, vol. IT-20 (2), pp. 284-287, March 1974.

Although the present disclosure has been described with reference to one or more examples, workers skilled in the art will recognize that changes may be made in form and detail without departing from the scope of the disclosure and/or the appended claims.

The invention claimed is:

1. A method of transmitting a digital signal for a network having at least four nodes comprising two transmitters, a full duplex relay, and a receiver, wherein said four nodes are connected together by non-orthogonal links implementing a spatially-distributed network code, the method comprising:

a coding step per transmitter, each of said two transmitter delivering a code word per block of K information bits, wherein said K information bits are associated with B code words of data streams;

a transmission step in which each of the two transmitters transmits its respective code words during N time slots;

an iterative joint detection/decoding step performed in the full duplex relay to separate data streams of code words coming from the two transmitters and to determine, per data stream of code words, a vector representative each of the respective code words;

a joint coding step in the full duplex relay for coding two vectors derived respectively from the data streams of code words coming from the two transmitters in order to determine redundancy information representative of two code words transmitted during N time slots;

a transmission step of the full duplex relay transmitting redundancy information during N time slots; and sequencing in the full duplex relay such that the redundancy information as transmitted from the two transmitters during the N time slots corresponds to the two code words transmitted during N preceding time slots; and sequencing in each of said two transmitters not to transmit a code word during N time slots after one of the two transmitters has transmitted B code words of data streams, wherein B is a parameter.

2. The method according to claim 1, wherein the iterative joint detection/decoding step implements hard decoding.

3. The method according to claim 1, wherein the iterative joint detection/decoding step implements soft decoding and the joint coding step implements soft coding and marginalization performed at bit level.

4. The method according to claim 1, wherein the iterative joint detection/decoding step implements soft decoding and the joint coding step implements soft coding and compression.

5. The A method according to claim 4, wherein the compression is performed using a minimum mean squared uncorrelated error criterion.

6. A non-transitory data medium including program instructions stored thereon and adapted to implement a digital signal transmission method in a network when said program instructions are loaded and executed in a Multiple Access Relay Channel (MARC) system, wherein the network has at least four nodes comprising two transmitters, a relay, and a receiver, said four nodes are connected together by non-orthogonal links implementing a spatially-distributed network code, wherein the program instructions comprise:

coding instructions that configure each of the two transmitter to deliver a code word per block of K information bits, wherein said K information bits are associated with B code words of data streams;

transmission instructions that configure each of the two transmitters transmits its respective code words during N time slots;

iterative joint detection/decoding instructions that configure the full duplex relay to separate data streams of code words coming from the two transmitters and to determine, per data stream of code word, a vector representative of received code word;

joint coding instructions that configure the full duplex relay to code two vectors derived respectively from the two data streams of code words in order to determine redundancy information representative of two code words transmitted during N time slots;

transmission instructions that configure the full duplex relay transmitting redundancy information during N time slots; and sequencing instructions that configure the full duplex relay to transmit the redundancy information during the N time slots following the N times slots when the corresponding code words are transmitted; and sequencing in each of said two transmitters not to transmit a code word during N time slots after one of the two transmitters has transmitted B code words of the data streams, wherein B is a parameter.

7. A reception method for a receiver of a Multiple Access Relay Channel (MARC) system, the method comprising:
a step of storing, in B+1 blocks, received data corresponding to pairs of B+1 code words transmitted respectively by each of two transmitters, each of the two transmitters transmitted during N time slots of a data stream, and representative of pairs of blocks of K information bits, which K bits are associated with B code words of redundancy information transmitted in a redundancy stream by a full duplex relay, each of the B code words being transmitted during N time slots such that the redundancy information transmitted during N time slots corresponds to the code words transmitted during N preceding time slots, where B is a parameter; and
a step of iterative joint detection/decoding in the receiver, performed in parallel on the B+1 received data blocks in order to separate each of the data streams received from each of the two transmitters starting from a first block, and also to separate the data streams coming from each of the two transmitters and from the full duplex relay starting from the following B blocks, and in order to act in parallel for the B blocks, per data stream coming from the two transmitters and per block, to determine a vector representative of K information bits associated with a code word by simultaneously decoding the data stream corresponding to each of the two transmitters and the associated redundancy stream coming from the relay and provided by the following data block.

8. A reception method for a receiver of a Multiple Access Relay Channel (MARC) system, the reception method comprising:
a step of storing in B+1 blocks received data corresponding to pairs of B code words transmitted respectively by each of two transmitters, each of the two transmitters transmitted during N time slots of a data stream, and representative of pairs of blocks of K information bits, which bits are associated with B code words of redundancy information transmitted by a relay in a redundancy stream, each of the B code words being transmitted during N time slots such that the redundancy information transmitted during N time slots corresponds to the code words transmitted during N preceding time slots, wherein B is a parameter; and
a step of iterative joint detection/decoding in the receiver in parallel on the B+1 received data blocks to separate as output from a first block of data streams received from the two transmitters, and as output from the following B−1 blocks the data streams coming from the two transmitters and from the full duplex relay, the B+1 blocks storing only redundancy information corresponding to the code words of the preceding data block, and for determining in parallel for the B blocks, per data stream coming from the two transmitters, and per block, a vector representative of K information bits associated with a code word by simultaneously decoding the data stream corresponding to the two transmitter and the associated redundancy stream coming from the full duplex relay and supplied by following data block.

9. A method of transmitting a digital signal for a network having at least four nodes comprising two transmitters, a full duplex relay, and a receiver, wherein the four nodes are connected together by non-orthogonal links implementing a spatially-distributed network code, the method comprising:
a coding step per transmitter, each of said two transmitters delivering a code word per block of K information bits, wherein said K information bits are associated with B code words of data streams;
a transmission step in which each of the two transmitters transmits its respective code words during N time slots;
an iterative joint detection/decoding step performed in the full duplex relay to separate data streams of code words coming from the two transmitters and to determine, per data stream of code word, a vector representative each of the respective code words;
a joint coding step in the full duplex relay for coding two vectors derived respectively from the data streams of code words coming from the two transmitters in order to determine redundancy information representative of two code words transmitted during N time slots;
a transmission step of the full duplex relay transmitting redundancy information during N time slots;
sequencing in the full duplex relay to transmit the redundancy information as transmitted during the N time slots following the N time slots when the corresponding code words are transmitted, wherein each of the two transmitter transmits a frame of B+1 consecutive code words, where B is a parameter and sequencing in the full duplex relay not to transmit redundancy information corresponding to the B+1 code word.

10. The method according to claim 9, wherein the iterative joint detection/decoding step implements hard decoding.

11. The method according to claim 9, wherein the iterative joint detection/decoding step implements soft decoding and the joint coding step implements soft coding and marginalization performed at bit level.

12. The method according to claim 9, wherein the iterative joint detection/decoding step implements soft decoding and the joint coding step implements soft coding and compression.

13. The method according to claim 12, wherein the compression is performed using a minimum mean squared uncorrelated error criterion.

* * * * *